(12) United States Patent
Lee et al.

(10) Patent No.: US 7,929,987 B2
(45) Date of Patent: Apr. 19, 2011

(54) APPARATUS AND METHOD FOR PREVENTING DEGRADATION OF RF PERFORMANCE DUE TO IMPEDANCE CHANGE OF ANTENNA IN MOBILE COMMUNICATION TERMINAL

(75) Inventors: Yeon-Joo Lee, Incheon (KR); Sung-Min Lee, Busan (KR); Chang-Young Kim, Suwon-si (KR); Jeong-Hun Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 992 days.

(21) Appl. No.: 11/702,903

(22) Filed: Feb. 6, 2007

(65) Prior Publication Data
US 2007/0236296 A1     Oct. 11, 2007

(30) Foreign Application Priority Data

Feb. 6, 2006  (KR) .......................... 10-2006-0011177

(51) Int. Cl.
*H04M 1/00* (2006.01)
(52) U.S. Cl. ................. 455/550.1; 455/67.11; 455/90.3; 330/302; 343/860
(58) Field of Classification Search ............... 455/248.1, 455/67.11, 84, 90.3, 550.1; 330/302; 343/860
See application file for complete search history.

(56) References Cited

U.S. PATENT DOCUMENTS

| | | | |
|---|---|---|---|
| 6,526,263 B1 * | 2/2003 | Saito ............................. | 455/78 |
| 7,071,776 B2 * | 7/2006 | Forrester et al. ............. | 330/129 |
| 2008/0129407 A1 * | 6/2008 | Matsuno ...................... | 333/17.3 |

* cited by examiner

*Primary Examiner* — Nhan Le
(74) *Attorney, Agent, or Firm* — The Farrell Law Firm, P.C.

(57) ABSTRACT

Disclosed are an apparatus and a method for preventing the degradation of RF performance due to a change in impedance of an antenna in a mobile communication terminal. The mobile communication terminal includes a plurality of impedance matching circuits and a controller of the mobile communication terminal is adapted to measure the reflection voltage of the antenna, select one impedance matching circuit corresponding to the measured reflection voltage, and connected with the antenna through the selected impedance matching circuit. As a result, when the impedance value of the antenna is changed, it is possible to prevent the degradation of performance of the RF module of the mobile communication terminal by using an impedance matching circuit, which can optimize the reflection loss caused by the reflection voltage of the antenna according to a change in impedance value.

14 Claims, 4 Drawing Sheets

APPARATUS AND METHOD FOR PREVENTING DEGRADATION OF RF PERFORMANCE DUE TO IMPEDANCE CHANGE OF ANTENNA IN MOBILE COMMUNICATION TERMINAL

PRIORITY

This application claims priority to an application entitled "Apparatus and Method for Preventing Degradation of RF Performance Due to Impedance Change of Antenna in Mobile Communication Terminal" filed with the Korean Intellectual Property Office on Feb. 6, 2006 and assigned Serial No. 2006-11177, the contents of which are incorporated herein by reference.

BACKGROUND OF THE INVENTION

1. Field of the Invention

The present invention relates to a mobile communication terminal, and in particular to an impedance matching circuit of an RF module of a mobile communication terminal.

2. Description of the Related Art

The term "impedance matching" is intended to include all the measures for reducing reflection caused by a difference in impedance between two different connection terminals when one output terminal and one input terminal are connected with each other. Such impedance matching is used for the purposes of reducing the reflection loss of an antenna in a mobile communication terminal when a wireless signal is output from the antenna when an RF module of the mobile communication terminal transmits or receives a wireless signal.

In general, all RF circuits are provided with characteristic impedance. The characteristic impedance means impedance which is set on the basis of one circuit or system. By setting a characteristic impedance basis, input and output terminals of an RF circuit are made to be compatible with each other. If reference impedance is set for all the RF circuits, reflection loss can be optimized even if special impedance matching is not executed. A mobile communication terminal also requires impedance matching. An impedance matching circuit employed in a mobile communication terminal is also designed in such a manner as to be capable of optimizing reflection loss on the basis of characteristic impedance, which is according to the antenna of the mobile communication terminal.

However, a mobile communication terminal may be subjected to a change in the impedance value of an antenna. For example, if a user inadvertently touches the antenna during telephone conversation, the impedance of the antenna may be increased or reduced due to the influence of the user's body. However, an impedance matching circuit for a conventional mobile communication terminal is only optimized to the preset characteristic impedance of an antenna. As a result, if the impedance of the antenna changes due to the influence of a human body or the like, an RF module for the conventional mobile communication terminal may be subjected to degradation in performance.

SUMMARY OF THE INVENTION

Accordingly, the present invention has been made to solve at least the above-mentioned problems occurring in the prior art, and an aspect of the present invention is to provide an apparatus and a method for preventing the degradation in performance of an RF module in a mobile communication terminal when the impedance value of the antenna of the mobile communication terminal changes due to an external influence.

Another aspect of the present invention is to provide an apparatus and a method of optimizing reflection loss according to a changed impedance value when a mobile communication terminal is subjected to the change in impedance value of the antenna thereof.

In order to achieve the above-mentioned aspects, there is provided an apparatus for preventing the degradation in RF performance due to a change in the impedance of an antenna in the mobile communication terminal. The apparatus includes a matching circuit unit having a plurality of impedance matching circuits which correspond to different reflection measuring values, the impedance matching circuits being designed in such a manner as to be capable of optimizing RF loss of an RF module for a mobile communication terminal according to a specific reflection coefficient measuring value; a reflection voltage measuring unit for measuring the reflection voltage of the antenna; a memory module for storing reflection coefficient measuring information for determining a reflection coefficient measuring value according to the reflection voltage measured by the reflection voltage measuring unit and matching circuit information containing reflection coefficient measuring values which correspond to the impedance matching circuits; and a controller, which determines a reflection coefficient measuring value according to the measured reflection voltage, selects one impedance matching circuit that is designed to be capable of optimizing the RF loss of the RF module for the determined reflection coefficient measuring value from among the impedance matching circuits, and executes impedance matching with the antenna through the selected impedance matching circuit.

There is also provided a method for preventing the degradation in RF performance due to a change in the impedance of an antenna that includes measuring the reflection voltage of the antenna of a mobile communication terminal; determining a reflection coefficient measuring value according to the measured reflection voltage; and selecting an impedance matching circuit corresponding to the determined reflection coefficient measuring value among the impedance matching circuits, and connecting the selected impedance matching circuit to the antenna.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
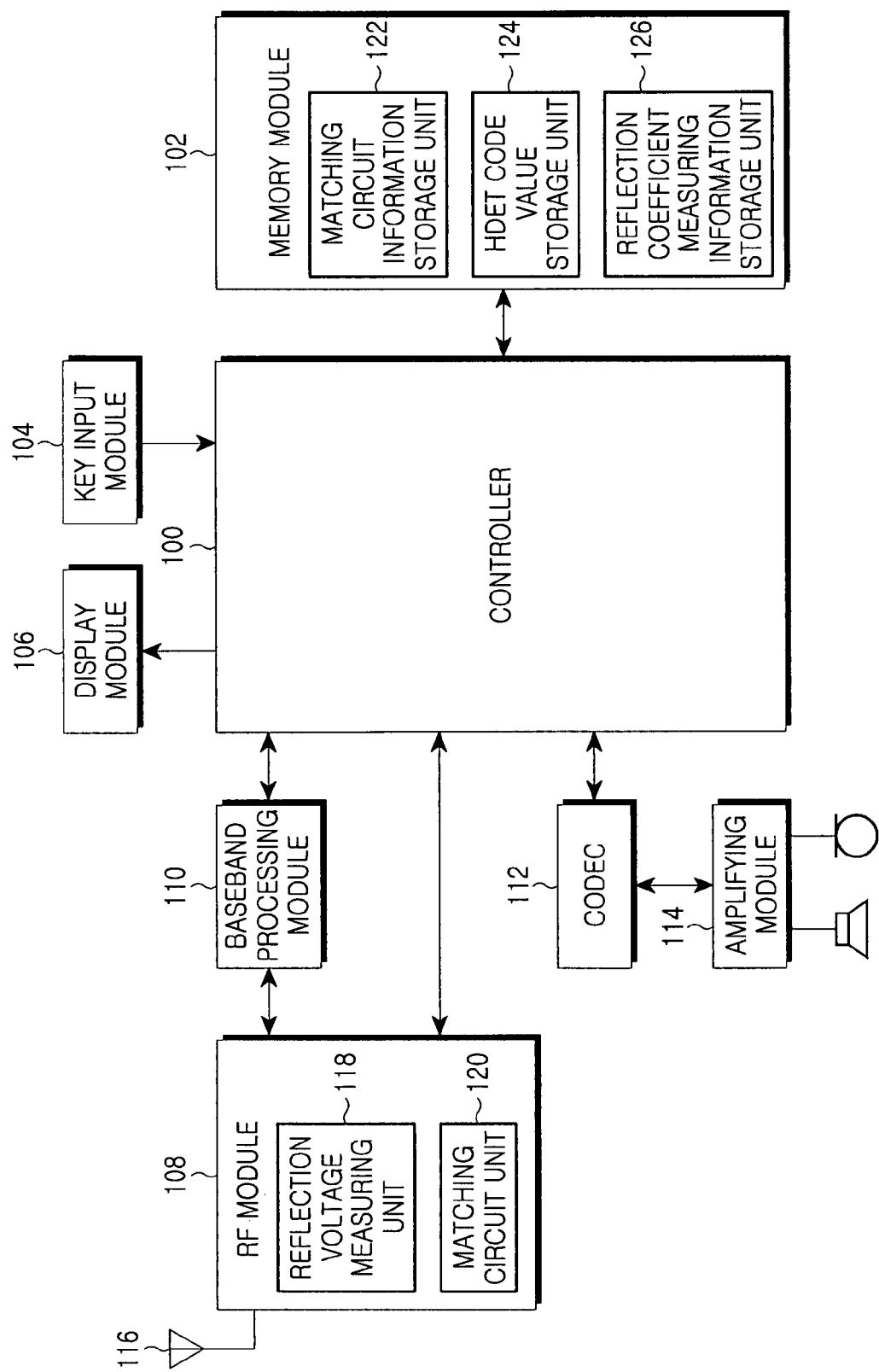
FIG. 1 is a block diagram of a mobile communication terminal according to the present invention.

Hereinafter, a preferred embodiment of the present invention will be described with reference to the accompanying drawings. In the following description and drawings, the same reference numerals are used to designate the same or similar components, so that repeated description on the same or similar components will be omitted. In the following description and accompanying drawings, detailed description for well-known function and construction, which may unnecessarily render the gist of the present invention ambiguous, will be omitted.

The present invention will be described in order to provide a complete understanding of the present invention. According to the present invention, a mobile communication terminal includes a plurality of impedance matching circuits, and a controller of the mobile communication terminal measures the reflection voltage of an antenna and selects an impedance matching circuit according to the measured reflection voltage among the impedance matching circuits, so that connection with the antenna is made through the selected impedance matching circuit. As a result in the present invention, when the impedance value of the antenna changes, an impedance matching circuit is used, which can optimize reflection loss caused by the reflection voltage of the antenna according to the change in impedance value, whereby it is possible to prevent the degradation in the performance of an RF module of the mobile communication terminal.

FIG. 1 is a block diagram of a mobile communication terminal according to the present invention.

Referring to FIG. 1, the mobile communication terminal includes a memory module 102, a key input module 104, a display module 106, a baseband processing module 110, a CODEC (Coder-Decoder) 112, and an RF module 108, which has a reflection voltage measuring unit 118 for measuring the reflection voltage of an antenna 116 according to a change in impedance value of the antenna 116, and a matching circuit unit 120 containing a plurality of impedance matching circuits. All of the components are connected to a controller 100. The controller 100 processes sound signals and data according to a protocol for telephone communication, data communication or wireless internet access, and controls respective components of the mobile communication terminal. In addition, the controller 100 receives a user's key input from the key input module 104 and controls the display module 106 according the key input, so that image information according to the user's key input can be produced and presented.

Figure 2:
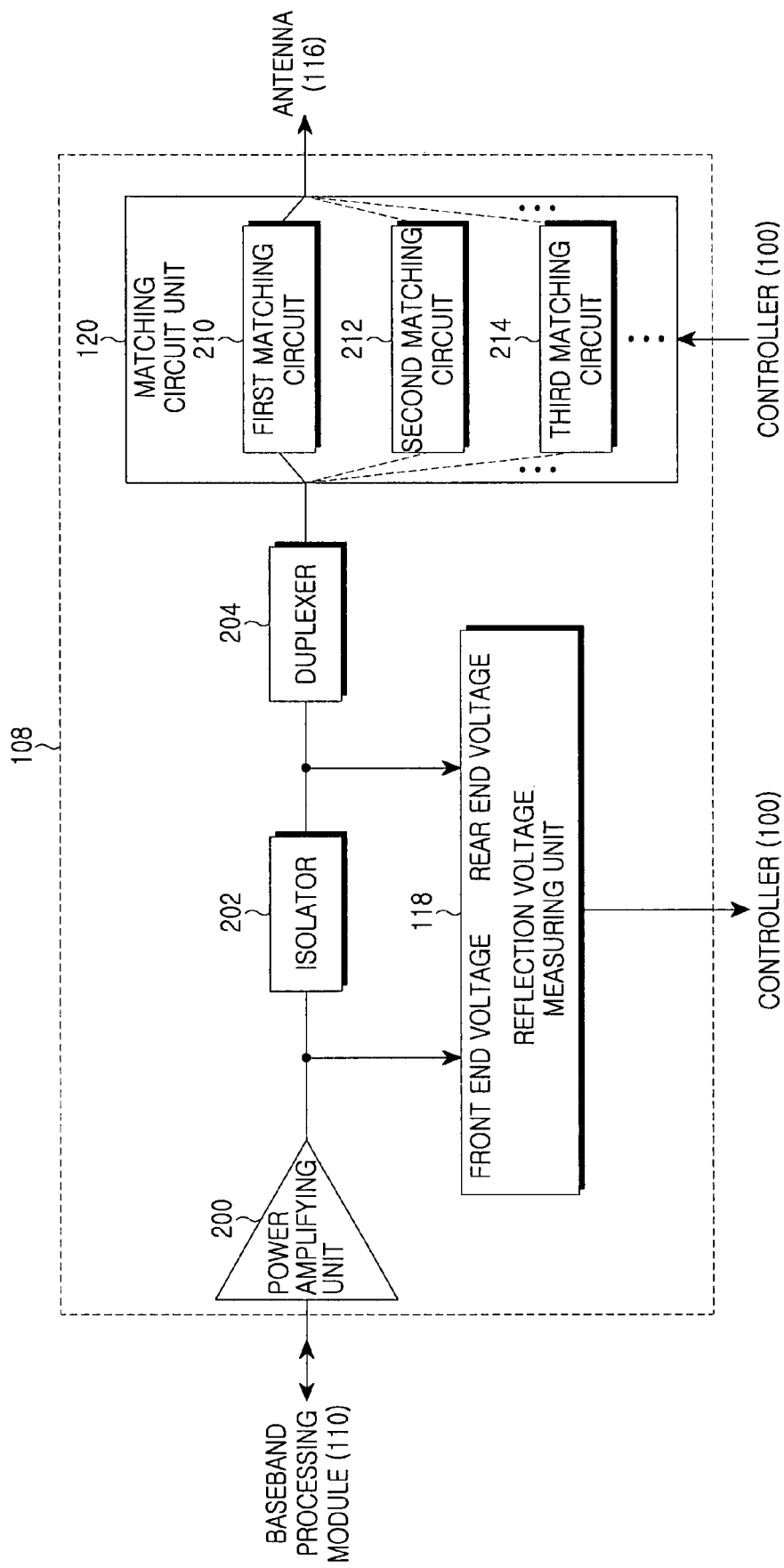
FIG. 2 is a detailed block diagram showing an RF module of the mobile communication terminal according to the present invention in detail.

FIG. 2 is a detailed diagram of the RF module 108. From the reflection voltage measuring unit 118 included in the RF module 108, the controller 100 receives and compares the voltage values measured at the front and rear ends of an isolator 202 of the RF module 108. In addition, the controller 100 determines a reflection coefficient measuring value for the current impedance of the antenna according to the difference between the compared voltage values, and selects an impedance matching circuit according the determined reflection coefficient measuring value. The controller 100 controls the matching circuit unit 120, so that connection with the antenna 116 is made through the selected impedance matching circuit, thereby transmitting and receiving signals.

In addition, the memory module 102, which is connected with the controller 100, stores information, on the basis of which the controller 100 determines a reflection coefficient measuring value according to the above-mentioned difference in voltage value. If the mobile communication terminal according to the present embodiment calculates the difference of the voltage values using an HDET (High power DETect) algorithm, the memory module 102 may be stored with conversion information for converting voltage values detected by the reflection voltage measuring unit 118 into HDET codes. The HDET algorithm is an algorithm for rectifying part of the output of a power amplifying unit (20-30 db) into a feedback DC (Direct Current) voltage, and converting the feedback DC voltage into a code value which can be recognized by an MSM (Mobile Station Modem) chip. The memory module 102 also contains impedance matching circuit information for the plurality of matching circuits, for each of which a specific reflection coefficient measuring value is set, so that a proper impedance matching circuit can be selected according to a reflection coefficient measuring value. A reflection coefficient measuring value is a value expressing a reflection coefficient, which is an indicator determined by calculating a quantity of reflection, which is produced by the difference in impedance, as a ratio of input voltage to reflection voltage. Specifically, a reflection coefficient measuring value is a value expressing a reflection coefficient as an RL (Return Loss), which is a value obtained by converting a reflection coefficient into a log scale (db) of power, or as a VSWR (Voltage Standing Wave Ratio), which is the magnitude of a standing wave produced by reflection. It is assumed that a VSWR is used as a reflection coefficient measuring value for the convenience of description.

In the memory module 102, a storage area for storing information for determining a reflection coefficient measuring value according to the above-mentioned difference in voltage value will be referred to as a reflection coefficient measuring information storage unit 126, and a storage area for storing matching circuit information items for allowing the selection of a suitable impedance matching circuit according to a reflection coefficient measuring value determined as described above will be referred to as a matching circuit information storage unit 122. In addition, in a case in which the mobile communication terminal according to the present embodiment calculates the difference in voltage value using the above-mentioned HDET algorithm, the memory module 102 may further comprise an HDET code value storage unit 124.

Such a memory module 102 may consist of a ROM (Read Only Memory), a flash memory, a RAM Random Access Memory), etc. Amongst them, the ROM stores various reference data and programs for processing and controlling the controller 100. The RAM provides a working memory for the controller 100, and the flash memory provides an area for storing various renewable storage data. The key input module 100 comprises various keys including numerical keys as described above and allows a user's key input to the controller 100.

In addition, the RF module 108 serves to transmit and receive RF signals to and from a base station. In addition, the RF module 108 converts a received signal into an IF (Intermediate Frequency) signal and outputs the IF signal to a baseband processing module 110, which is connected with the controller 100, and the RF module 108 converts an IF signal inputted from the baseband processing module 110 into an RF signal, and then transmits the RF signal. In addition, the RF module 108 of the mobile communication terminal includes a reflection voltage measuring unit 118 for measuring reflection voltage, which is reflected according to changed impedance when the impedance of the antenna 116 changes, and a matching circuit unit 120 having a plurality of impedance matching circuits.

The reflection voltage measuring unit 118 measures voltage values at the front and rear ends of an isolator 202 (see FIG. 2) in the RF module 108 and outputs the measured voltage values to the controller 100. Here, the isolator 202 is a circuit device which is capable of transferring an electromagnetic wave in one direction of a transmission line but not in the other direction of the transmission line, wherein such an isolator 202 is employed so as to minimize the influence caused by the reflection voltage of the antenna 116. That is, the reflection voltage of the antenna 116 can be detected at the rear end of the isolator but the reflection voltage of the antenna is blocked by the isolator 202, so that the reflection voltage is not transferred to the front end of the isolator 202. Therefore, it is possible to check the influence caused by the reflection voltage by comparing the difference in voltage between the front and rear ends of the isolator 202.

The matching circuit unit 120 has a plurality of impedance matching circuits. The impedance matching circuits are optimized to different reflection coefficient measuring values. That is, a matching circuit 1 can be an impedance matching circuit designed in such a manner as to optimize the reflection loss when its reflection coefficient measuring value is VSWR 1.2:1, and an impedance matching circuit 2 can be an impedance matching circuit designed to optimize the reflection loss when its reflection coefficient measuring value is VSWR 1.5:1. The matching circuit unit 120 has a plurality of impedance matching circuits which can be used for variously different reflection coefficient measuring values, and connects an impedance matching circuit selected by the selection of the control 100 to the antenna 116 of the mobile communication terminal. The detailed construction of the RF module 108 will be described with reference to FIG. 2.

The baseband processing module 110 is a BAA (Baseband Analog ASIC), which converts a digital signal of baseband applied from the controller 100 into an analog IF signal and applies the analog IF signal to the RF module 108, and which converts an analog IF signal applied from the RF module into a digital signal of baseband and apply the digital signal of baseband to the controller 100.

In addition, the CODEC 112, which is connected with the controller 100, is also connected with a microphone and a speaker through an amplifying module 114, wherein the CODEC 112 PCM-encodes (Pulse Code Modulation encodes) a sound signal input from the microphone and outputs a sound data to the controller, and the CODEC 112 PCM-decodes a sound data and outputs a sound signal to the speaker through the amplifying module 112. In addition, the amplifying module 114 amplifies a sound signal output from the microphone or a sound signal output from the speaker, wherein the amplifying module 114 tunes the volume of the speaker and the gain of the microphone according to the control of the controller 100.

Referring again to FIG. 2, the RF module 106 of the mobile communication terminal includes a power amplifying unit 200, an isolator 202, a duplexer 204, a matching circuit unit 120, and a reflection voltage measuring unit 118. Here, the power amplifying unit 200 amplifies signals input into/output from the RF unit 108, and the isolator 202 is employed so as to minimize the influence caused by the reflection voltage reflected from the antenna 116, as described above. In addition, the duplexer 204 separates signals transmitted and received through the RF unit 108, and outputs only a desired frequency.

The reflection voltage measuring unit 118 is connected to the front end of the isolator 202, i.e., the input end of the isolator 202, and the rear end of the isolator 202, i.e., the output end of the isolator 202, and measures the voltage applied to the front end of the isolator 202 and the voltage applied to the rear end of the isolator 202. In addition, the reflection voltage measuring unit 118 outputs the voltage values to the control unit 100. The matching circuit unit 120 comprises a plurality of impedance matching circuits (a first matching circuit 210, a second matching circuit 212, and an nth matching circuit 214), which are designed to optimize reflection loss when the reflection coefficient measuring coefficients are different from each other. Any number of matching circuits can be provided, limited only by size and cost of the mobile communication terminal. In addition, the matching circuit unit 120 connects an impedance matching circuit, which is selected among the impedance matching circuits according to the control of the controller 100, to the antenna 116, so that the reflection loss caused by the current impedance value of the antenna 116 can be optimized.

Figure 3:
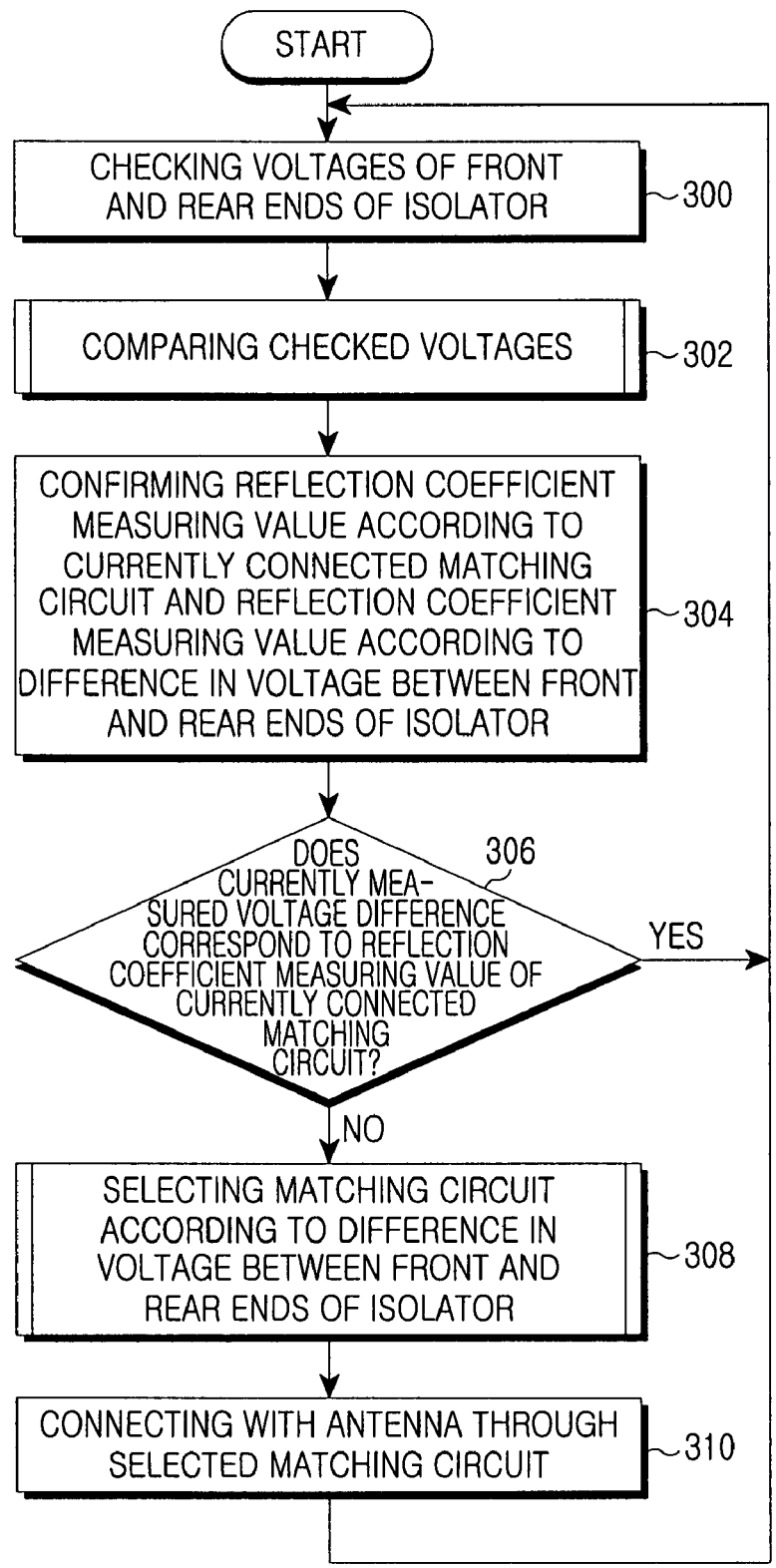
FIG. 3 is a flowchart showing an operation of selecting a matching circuit according to the degree of degradation when such degradation is caused in the RF module of the mobile communication terminal according to the present invention.

FIG. 3 is a flowchart showing the operation of a selecting matching circuit in connection with the degree of degradation occurring in the RF module of the mobile communication terminal according to the present invention.

Referring to FIG. 3, when a user drives the RF module 108 so as to exchange wireless signals, the controller 100 of the mobile communication terminal proceeds to step 300 and measures the voltages applied to the front and rear ends of the isolator 202. Then, the controller 100 proceeds to step 302 and compares the measured voltages.

Here, the controller 100 may compare the magnitudes of the voltage values by using an HDET algorithm as mentioned above. In that event, the controller 100 converts the magnitudes of the voltages measured by the reflection voltage measuring unit 118 into HDET code values, and calculates the difference between the two voltage values which have been converted into the HDET code values. The detailed operating flow of step 302 in that event, i.e., in a case in which the mobile communication terminal compares the magnitudes of voltages using the HDET algorithm will be described in detail below with reference to FIG. 4.

Then, the controller 100 proceeds to step 304 and confirms a reflection coefficient measuring value according to a matching circuit which is currently connected to the antenna, and a reflection coefficient measuring value according to the difference between the voltages checked at the front and rear ends of the isolator 202. Various values, such as VSWR (Voltage Standing Wave Ratio), RL (Return Loss), may be used as the reflection coefficient measuring values. If the voltages measured from the front and rear ends of the isolator 202 are compared with each other by using the HDET algorithm, in step 304, the difference between the converted HDET codes for the two voltages may be determined by using reflection coefficient measuring information stored in the reflection coefficient measuring information storage unit 126, thereby determining the reflection coefficient measuring value according to the difference between the two voltages. Table 1 shows an example of reflection coefficient measuring information, which can be used when the reflection coefficient measuring value (VSWR) is determined by using the difference between the converted HDET codes for the two voltages.

TABLE 1

| Difference between HDET code values for two voltages | VSWR |
| --- | --- |
| 0~4 | 1.20:1 |
| 5~9 | 1.35:1 |
| 10~14 | 1.50:1 |
| 15~19 | 2.25:1 |
| 20~25 | 3.00:1 |

When the reflection coefficient measuring information shown in Table 1 are used, if the difference between the converted HDET code value for the two voltage values measured at the front and rear ends of the isolator 202 is 10, the controller 100 may consider the reflection coefficient measuring value according to the current impedance of the antenna 116 as 1.5:1.

The controller 100 proceeds to step 306 and determines whether the reflection coefficient measuring value between the voltage values, which are currently measured at the front and rear ends of the isolator 202, corresponds to a reflection coefficient measuring value according to an impedance matching circuit which is currently connected with the antenna 116. The impedance matching circuit may have a specific range of reflection coefficient measuring values rather than corresponding to only one reflection coefficient measuring value. In that event, the controller 100 performs a procedure for determining whether a reflection coefficient measuring value according to the measured voltage values is included within the range of reflection coefficient measuring values according to the impedance matching circuit.

In step 306, if it is determined that the reflection coefficient measuring value of the currently connected impedance matching circuit corresponds to the reflection coefficient measuring value according to the difference between the reflection voltage values, the controller 100 proceeds to step 300 again while maintaining the connection with the currently connected impedance matching circuit and measures voltages applied to the front and rear ends of the isolator 202.

However, in step 306, if it is determined that the reflection coefficient measuring value of the currently connected matching circuit does not correspond to the reflection coefficient measuring value according to the difference between the voltages currently measured at the front and rear ends of the isolator 202, the controller 100 proceeds to step 308 and selects an impedance matching circuit according to the reflection coefficient measuring value determined by the difference between the voltage values, which are currently measured at the front and rear ends of the isolator 202. The controller 100 can determine the reflection coefficient measuring value according to the difference between the currently measured voltage values from the information stored in the reflection coefficient measuring information storage unit 126, and confirm which is the impedance matching circuit according to the reflection coefficient measuring value from the matching circuit information stored in the matching circuit information unit 122. The procedure in which the controller 100 determines a reflection coefficient measuring value using the voltage values measured from the rear and front ends of the isolator 202 and selects a matching circuit corresponding to the determined reflection coefficient measuring value as mentioned above will be described in detail below with reference to FIG. 5.

If an impedance matching circuit is selected through step 308, the controller 100 proceeds to step 310 and controls the matching circuit unit 120 in such a manner that the selected impedance matching circuit can be connected with the antenna 116. Then, wireless signals transmitted/received through the antennal 116 are input/output through the selected impedance matching circuit. Accordingly, the present invention allows impedance matching with the antenna 116 so that reflection loss can be optimized according to the impedance value of the antenna 116 even if the impedance value of the antenna 116 changes due to an external influence, such as the human body or the like. Therefore, the invention can prevent the degradation in performance of the RF module 108, which is caused according to a change in impedance of the antenna 116.

Figure 4:
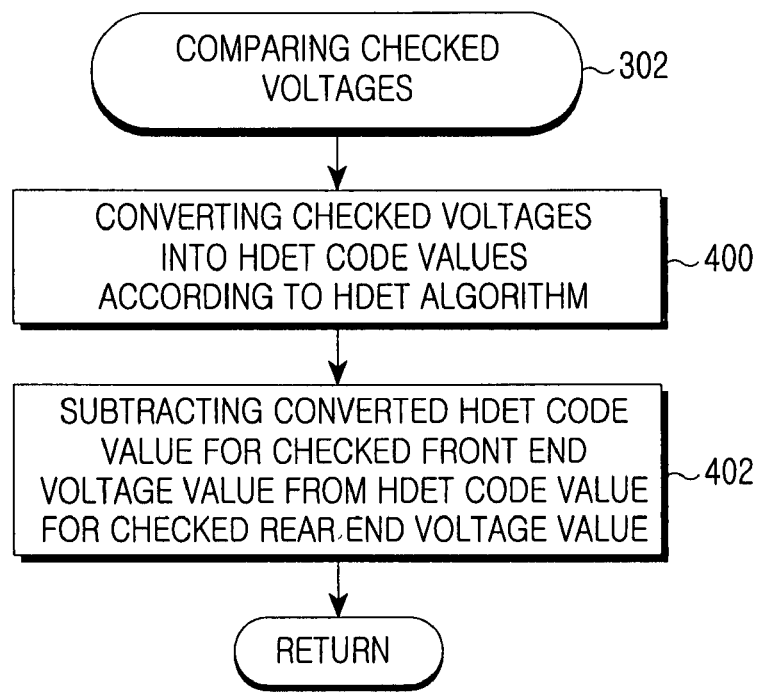
FIG. 4 is a flowchart showing an operation for determining differences between voltage values checked from the RF module in the mobile communication terminal according to the present invention.

FIG. 4 is a flowchart illustrating the operation for calculating the difference between the voltages checked from the RF module 108 using an HDET algorithm in the mobile communication terminal according to the present invention.

As described above, the HDET algorithm rectifies a part of the power output from the power amplifying unit 200 of the RF module 108 into DC voltage and converts the DC voltage into a code value capable of being conceived by an MSM chip. If the voltages of the rear and front ends of the isolator 202 are measured by the reflection voltage measuring unit 118, the controller 100 proceeds to step 400, in which the voltages measured at the rear and front ends of the isolator 202 are converted into the HDET code values. In addition, the controller 100 proceeds to step 402, in which the controller 100 subtracts the converted HDET code value for the voltage value measured at the front end of the isolator 202 from the HDET code value for the voltage value measured at the rear end of the isolator 202. Then, the degree of increase in voltage according to the reflection voltage of the antennal 116 can be converted into and determined as an HDET code value due to the property of the isolator 202. Then, the controller 100 determines a reflection coefficient measuring value according to the current impedance of the antenna 116 using the difference between the two voltage values which have been converted into the HDET code values according to the checking result in step 306, and then selects a suitable impedance matching circuit using the determined reflection coefficient measuring value.

Figure 5:
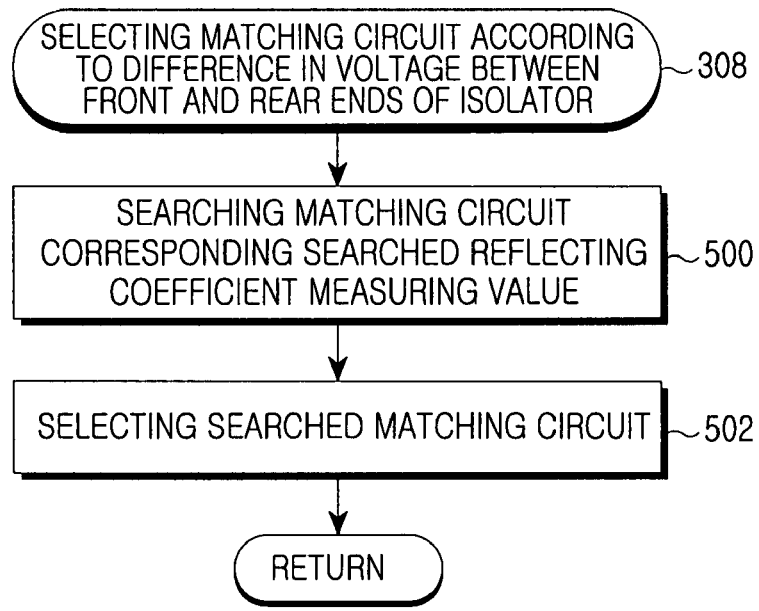
FIG. 5 is a detailed flowchart showing in more detail an operation of selecting a matching circuit according to the degree of produced degradation when such degradation is produced in the RF module of the mobile communication terminal according to the present invention.

FIG. 5 is a flowchart illustrating the operation for selecting an impedance matching circuit according to the degree of degradation of the RF module 108 when such degradation is caused in the RF module 108 of the mobile communication terminal.

Referring to FIG. 5, as the result of the determination in step 306 in FIG. 3, if it is determined that the reflection coefficient measuring value of the currently connected impedance matching circuit does not correspond to the reflection coefficient measuring value according to the voltages currently measured at the rear and front ends of the isolator 202, the controller 100 proceeds to step 500 and searches for impedance matching circuit information corresponding to the reflection coefficient measuring value, which has been determined from the difference in voltage value between the front and rear ends of the isolator 202 in step 304. Here, reflection coefficient measuring values or ranges, which correspond to the impedance matching circuits contained in the matching circuit unit 120, are stored in the matching circuit information storage unit 122 of the memory module 102. Table 2 and Table 3 show examples of such information stored in such a matching circuit information storage unit 122.

TABLE 2

| VSWR | Impedance matching circuit |
|---|---|
| 1.20:1 | 1 |
| 1.35:1 | 2 |
| 1.50:1 | 3 |
| 2.25:1 | 4 |
| 3.00:1 | 5 |

TABLE 3

| VSWR | Impedance matching circuit |
|---|---|
| 1.00:1 | 1 |
| 1.21:1 | 2 |
| 1.41:1 | 3 |
| 2.01:1 | 4 |
| 2.81:1 | 5 |

When the matching circuit information shown in Table 2 or Table 3 is used, if the reflection coefficient measuring value (VSWR) determined from the voltage values measured at the front and rear ends of the isolator in step 304 is 1.50:1 and the reflection coefficient measuring value or range of the currently connected impedance matching circuit is 1.20:1 or 1.00:1~1.20:1 as the result of the determination in step 306, that is, if the reflection coefficient measuring value calculated from the measured voltage values does not correspond to the reflection coefficient measuring value of the currently connected impedance matching circuit, the controller 100 uses the information shown in Table 2 or Table 3, thereby selecting the impedance matching circuit No. 3, which corresponds to the reflection coefficient measuring value VSWR 1.50:1 in step 500. The controller 100 proceeds to step 502 and is connected with the impedance matching circuit selected in step 500, so that wireless signals can be transmitted or received through the connected impedance matching circuit. According to the present invention, the impedance matching circuit is optimized to a reflection coefficient measuring value, which is determined according to a varied impedance value, even if the impedance value of the antenna 116 is changed due to an external influence such as a contact of the user's body or the like. As a result, it is possible to prevent the degradation in performance of the RF module 108, which is caused due to the change of impedance value of the antenna.

According to the present invention, even if the impedance value of an antenna changes due to the external influence, an impedance matching circuit is used, which is optimized to the changed impedance value. As a result, it is possible to optimize the reflection loss according to the change of impedance value of the antenna, thereby preventing the degradation in RF performance of the mobile communication terminal.

Although specific embodiments of the present invention have been described, it will be appreciated that various modifications and variations can be made without departing from the scope of the present invention. In particular, although it has been described that antenna reflection voltages of the RF module 108 are measured using an HDET algorithm, the present invention is not limited to this. That is, it is possible either to use another method beyond such an HDET algorithm or to directly calculate RL or VSWR from measured reflection voltages as mentioned above without using such an HDET algorithm so as to select a suitable impedance matching circuit using the calculated RL or VSWR. Accordingly, the present invention is intended to be determined not by the above embodiments but on the basis of the claims and equivalents thereof.

What is claimed is:

1. An apparatus for preventing degradation in RF performance due to a change in impedance of an antenna in a mobile communication terminal, the apparatus comprising:
   a matching circuit unit having a plurality of impedance matching circuits, corresponding to different reflection measuring values, the impedance matching circuits being designed to optimize an RF module for the mobile communication terminal according to a reflection coefficient measuring value;
   a reflection voltage measuring unit for measuring a reflection voltage of the antenna;
   a memory module for storing reflection coefficient measuring information for determining the reflection coefficient measuring value according to the reflection voltage measured by the reflection voltage measuring unit, and matching circuit information containing a plurality of reflection coefficient measuring values usable for variously differing reflection coefficient measuring values corresponding to the impedance matching circuits; and
   a controller for determining a reflection coefficient measuring value according to the measured reflection voltage, selecting one impedance matching circuit designed to optimize the RF module for the determined reflection coefficient measuring value from among the impedance matching circuits, and connecting the selected impedance matching circuit to the antenna.

2. The apparatus of claim 1, wherein the impedance matching circuits are designed to optimize the RF module of the mobile communication terminal according to a range of the plurality of reflection coefficient measuring values.

3. The apparatus of claim 1, wherein the controller measures voltages at a front end and at a rear end of an isolator contained in the RF module and then measures the reflection voltage of the antenna, using a difference between the measured voltages.

4. The apparatus of claim 3, wherein the controller converts the voltage values of the front end and the rear end into High power DETect (HDET) code values using an HDET algorithm and measures the reflection voltage by subtracting the converted HDET code value for the voltage value of the front end from the converted HDET code value for the voltage value of the rear end.

5. The apparatus of claim 4, wherein the controller selects an impedance matching circuit according to a reflection coefficient measuring value corresponding to a difference of the converted HDET values to impedance-match with the antenna.

6. The apparatus of claim 5, wherein the memory module further stores reflection coefficient measuring information including information for the plurality of reflection coefficient measuring values, which correspond to HDET values, to calculate a reflection coefficient measuring value corresponding to a difference of converted HDET values for the voltage values.

7. The apparatus of claim 1, wherein the plurality of reflection coefficient measuring values are any one of VSWR (Voltage Standing Wave Ratio) and RL (Return Loss).

8. A method for preventing degradation of RF performance according to a change in impedance of an antenna in a mobile communication terminal, the method comprising:
   measuring a reflection voltage of the antenna of the mobile communication terminal;
   determining a reflection coefficient measuring value according to the reflection voltage measured in the reflection voltage measuring step; and selecting an impedance matching circuit corresponding to the determined reflection coefficient measuring value from among a plurality of impedance matching circuits, and connecting with the antenna the selected impedance matching circuit, wherein a memory module is provided to store reflection coefficient measuring information for determining the reflection coefficient measuring value according to the measured reflection voltage and matching circuit information containing a plurality of reflection coefficient measuring values usable for variously differing reflection coefficient measuring values corresponding to the impedance matching circuits.

9. The method of claim 8, wherein the measuring step comprises:

measuring the voltages of a front end and a rear end of an isolator contained in the RF module; and determining the difference between the measured voltages.

10. The method of claim 9, wherein the voltage difference determining step comprises:

converting the voltage values of the front end and the rear end into HDET code values using an HDET algorithm; and measuring the reflection voltage by subtracting the converted HDET code value for the voltage value of the front end from the converted HDET code value for the voltage value of the rear end.

11. The method of claim 10, wherein the reflection coefficient measuring value determining step comprises determining a reflection coefficient measuring value corresponding to the converted HDET value for the reflection voltage.

12. The method of claim 8, wherein the selecting step comprises:

confirming a reflection coefficient measuring value for the impedance matching circuit which is currently impedance-matched with the antenna;

determining if the reflection coefficient measuring value according to the currently measured reflection voltage corresponds to the reflection coefficient measuring value of the impedance matching circuit which is currently impedance-matched with the antenna; and selecting an impedance matching circuit corresponding to the reflection coefficient measuring value according to the currently measured reflection voltage according to the reflection coefficient measuring value determination, and impedance matching with the antenna is executed through the selected impedance matching circuit.

13. The method of claim 8, wherein the impedance matching circuits are designed to optimize the RF module of the mobile communication terminal according to a range of the plurality of reflection coefficient measuring values.

14. The method of claim 13, wherein the selecting step comprises:

confirming a range the plurality of reflection coefficient measuring values for the impedance matching circuit which is currently impedance-matched with the antenna;

checking step for checking whether the reflection coefficient measuring value according to the currently measured reflection voltage is included in the range of the plurality of reflection coefficient measuring values of the impedance matching circuit which is currently impedance-matched with the antenna; and selecting an impedance matching circuit corresponding to the reflection coefficient measuring value according to the currently measured reflection voltage according to the reflection coefficient measuring value determination, and impedance matching with the antenna is executed through the selected impedance matching circuit.

* * * * *